United States Patent
Nishiura et al.

[11] Patent Number: 6,112,974
[45] Date of Patent: Sep. 5, 2000

[54] WIRE BONDING METHOD

[75] Inventors: Shinichi Nishiura, Fussa; Nobuo Takeuchi, Musashimurayama, both of Japan

[73] Assignee: Kabushiki Kaisha Shinkawa, Tokyo, Japan

[21] Appl. No.: 09/415,452

[22] Filed: Oct. 8, 1999

[30] Foreign Application Priority Data

Oct. 8, 1998 [JP] Japan .................................. 10-286203

[51] Int. Cl.[7] .......................... B23K 31/00; B23K 31/02; B23K 1/06; B23K 5/20; B23K 37/00
[52] U.S. Cl. .................... 228/180.5; 228/1.1; 228/110.1; 219/56.1; 219/56.21; 219/56.22
[58] Field of Search .............................. 228/180.5, 110.1, 228/1.1; 219/56.1, 56.21, 56.22

[56] References Cited

U.S. PATENT DOCUMENTS

| 4,068,371 | 1/1978 | Miller ......................................... 29/628 |
| 4,932,584 | 6/1990 | Yamazaki et al. ....................... 228/179 |
| 5,148,964 | 9/1992 | Shimizu ................................... 228/102 |
| 5,205,463 | 4/1993 | Holdgrafer et al. .................... 228/102 |
| 5,259,548 | 11/1993 | Yamazaki et al. .................... 228/180.5 |
| 5,863,810 | 1/1999 | Kaldenberg ............................... 438/27 |
| 5,884,398 | 3/1999 | Eldridge et al. ........................... 29/843 |
| 5,989,995 | 11/1999 | Nishiura et al. ........................ 438/617 |

FOREIGN PATENT DOCUMENTS

| 5-60657 | 9/1993 | Japan . |
| 10-189641 | 7/1998 | Japan . |
| 11074451 | 3/1999 | Japan . |

*Primary Examiner*—Patrick Ryan
*Assistant Examiner*—Zidia Pittman
*Attorney, Agent, or Firm*—Koda & Androlia

[57] ABSTRACT

A wire bonding method comprising the steps of raising a capillary after bonding a ball formed on the tip end of the wire extending from the tip end of a capillary to a first bonding point, moving the capillary to a position located at an upward inclination in the direction of a second bonding point, further moving the capillary to a position located at an upward inclination in the opposite direction from the second bonding point, then moving the capillary to a position located at an upward inclination in the direction of the second bonding point, and then lowering the capillary so that the wire is bonded to the second bonding point by the capillary, thus producing a stable low-height M-shaped wire loop between the first and second bonding point.

3 Claims, 5 Drawing Sheets

WIRE BONDING METHOD

BACKGROUND OF THE INVENTION

1. Field of the Invention

The present invention relates to a wire bonding method in which a wire passing through a capillary is connected to a first bonding point and second bonding point by the capillary, and more particularly, to an M-shape wire loop formation method.

2. Prior Art

Japanese Patent Application Laid-Open (Kokai) No. H10-189641 discloses, in its column 4, line 22-column 5, line 24 and in FIGS. 2 and 3, an improvement of a trapezoidal wire loop which is disclosed, for example, in FIG. 2 of Japanese Patent Application Publication (Kokoku) No. H5-60657. In this improved wire loop, a part of the upper linear portion of the trapezoidal wire loop is formed in a downward bow shape, so that the wire loop is in substantially an M-shape. Below, this loop shape will be referred to as an M-shaped loop.

The M-shaped loop will be described in detail below with reference to FIGS. 4 through 6.

As shown in FIG. 4, the M-shaped wire loop is formed when upper surface (first bonding point) of a pad 2a on a semiconductor chip 2 mounted on a lead frame 1 and the upper surface (second bonding point) of a lead 1a on the lead frame 1 are connected by a wire 3, and it consists of a neck height part 31, a trapezoid length part 32 and an inclined part 33. Kinks 3a and 3b are formed at both ends of the trapezoid length part 32, and a kink 3c is formed in the trapezoid length part 32 so that the shape of the trapezoid length part 32 is bowed downward. This M-shaped loop is formed by the capillary that is moved as shown in FIG. 5 by the steps shown in FIG. 6.

As shown in steps (a) of FIG. 6, the capillary is lowered with a clamper (not shown) which holds the wire 3 maintained in a closed state, and a ball formed on the tip end of the wire is bonded to the first bonding point A. Afterward, the capillary 4 is raised to point B while the wire 3 is delivered. Next, as shown in step (b), a reverse operation is performed in which the capillary 4 is moved horizontally to point C in the opposite direction from the second bonding point G. As a result, a first kink 3a is formed in a portion of the wire 3. The wire 3 delivered in the process from point A to point C forms the neck height part 31 shown in FIG. 5.

Next, in step (c), the capillary 4 is raised to point D1, delivering the wire 3. Afterward, in step (d), the capillary 4 is moved to point D2 in the direction of the second bonding point G. Then, in step (e), the capillary 4 is raised to point D while the wire 3 is delivered. As a result of these steps (d) and (e), a second kink 3c is formed in the wire 3. The length of wire delivered in the operation from point D1 to point D2 (i.e., the length from the first kink 3a to the second kink 3c) forms the first horizontal wire part 34 shown in FIG. 5.

Next, in step (f), the capillary 4 is moved in the opposite direction from the second bonding point G; in other words, a second reverse operation is performed so that the capillary 4 is moved horizontally to point E. As a result of this operation from point C to point E, a third kink 3b is formed in the wire 3. The wire 3 delivered at this time forms the second horizontal wire part 35 shown in FIG. 5. Next, in step (g), the capillary 4 is raised to point F1 while an amount of wire 3 that will form the inclined part 33 shown in FIG. 5 is delivered; and then the clamper (not shown) is closed. When the clamper is closed, no wire 3 is delivered even if the capillary 4 is subsequently moved. Next, in step (h), the capillary 4 is moved horizontally to point F in the direction of the second bonding point G. Further, in steps (h) and (i), the capillary 4 is positioned at the second bonding point G by being caused to perform a circular-arc movement or by being caused to perform a circular-arc movement and then lowered; as a result, the wire 3 is bonded to the second bonding point.

In the prior art described above, the track of the capillary 4 is complicated, as shown in FIGS. 5 and 6. Since the amount of movement of the capillary 4 is large, a considerable amount of time is required for bonding. Furthermore, as a result of the reverse operation in step (b), the wire 3 is bent from the root (first bonding point A); and then the wire 3 is pulled in the direction of arrow in FIG. 7 so that the root portion of the wire 3 (at the first bonding point A) is returned to its original position in steps (h) through (i), and damage such as cracking, breaking, etc. may occur in the neck part 30 of the wire 3 as shown in FIG. 7.

Furthermore, in the M-shaped wire loop, since the elasticity of the wire loop shape as a whole is large, there may be cases in which the kinks 3a, 3b and 3c are pulled and extended in steps (g) through (i), resulting in that the neck height part 31 extending from the first bonding point A to the first kink 3a cannot return to the original perpendicular position; and this causes differences in the wire loop shape and in the height Ha of the kink 3a. In some cases, the height Hb of the kink 3b becomes higher than the height Ha as a result of such fluctuations in the height Ha, or as a result of rebound due to plastic deformation of the wire 3 at the time of bonding to the second bonding point G or of the mold flow that occurs in subsequent processes following wire bonding, etc. As a result, the height Hb of the kink 3b is approximately 200 to 400 $\mu$m. Thus, it is difficult to form a wire loop with a stable overall height of 200 $\mu$m or less.

SUMMARY OF THE INVENTION

In view of the above, the object of the present invention is to provide a wire bonding method for forming an M-shaped wire loop in which the track of the capillary is simple and the amount of movement of the capillary is small so that the bonding time can be short, and in which damages to the neck part of the wire can be avoided.

The second object of the present invention is to provide a wire bonding method which allows a stable formation of a low wire loop in which the overall height of the wire loop is 200 $\mu$m or less.

The above objects are accomplished by unique steps taken in a wire bonding method in which a wire that passes through a capillary is connected to a first bonding point and second bonding point by the capillary; and in the present invention, [a] the capillary is raised after a ball formed on the tip end of the wire extending from the tip end of the capillary is bonded to the first bonding point, [b] the capillary is then moved to a position located at an upward inclination in the direction of the second bonding point, [c] the capillary is then moved to a position located at an upward inclination in the opposite direction from the second bonding point, [d] the capillary is then moved to a position located at an upward inclination in the direction of the second bonding point, and then [e] the capillary is lowered so as to bond the wire to the second bonding point.

DETAILED DESCRIPTION OF THE PREFERRED EMBODIMENTS

One embodiment of the present invention will be described with reference to FIGS. 1 and 2.

Figure 1:
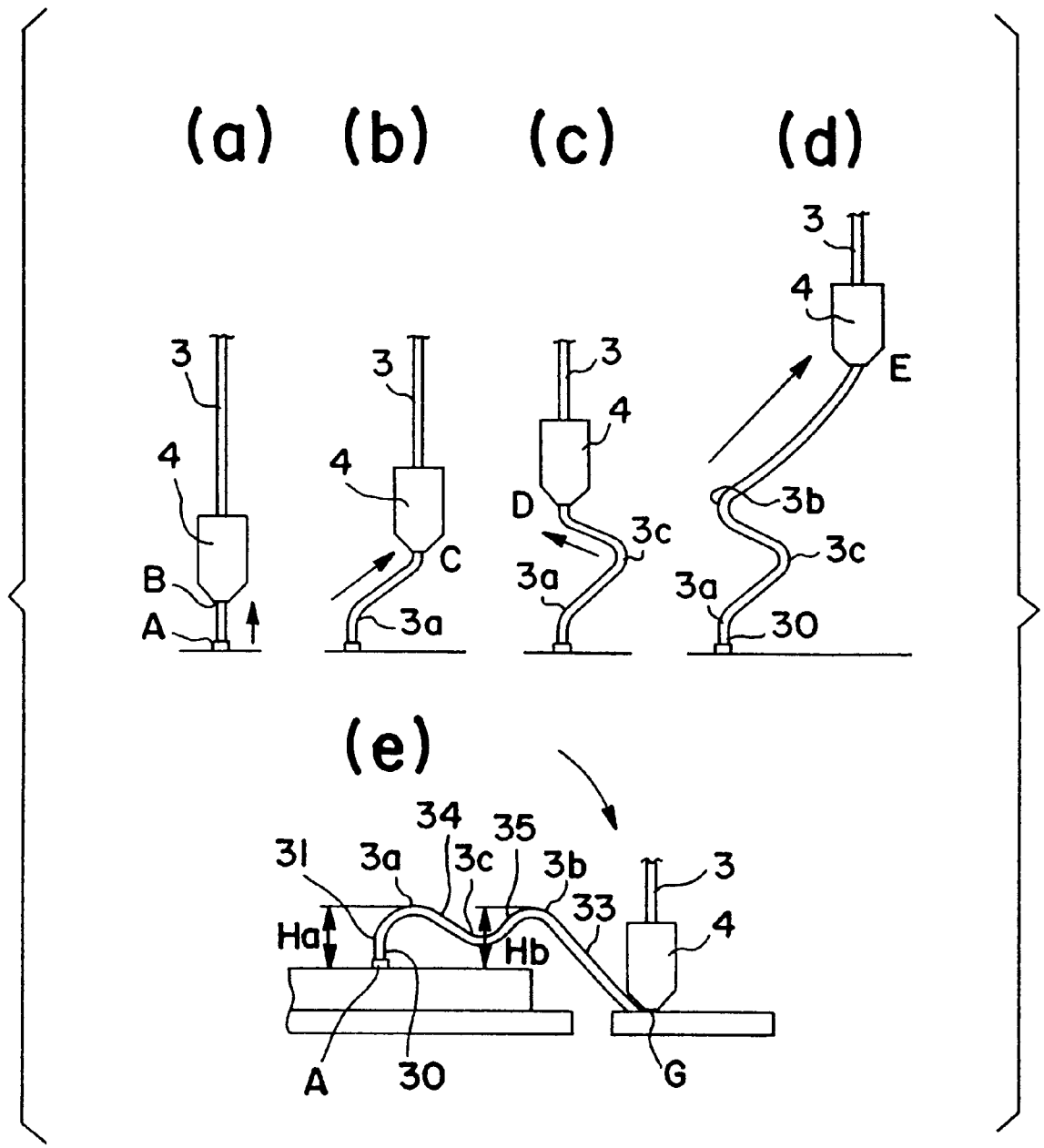
FIG. 1 shows the steps (a) through (e) of the wire bonding method according to one embodiment of the present invention.

First, in step (a) of FIG. 1, which is the same as in a conventional method, the capillary 4 is lowered with a clamper (not shown) that holds the wire 3 maintained in a closed state, and the ball formed on the tip end of the wire is bonded to the first bonding point A. Afterward, the capillary 4 is raised to point B, delivering the wire 3.

Next, the process that characterizes the present invention is performed.

Figure 2:
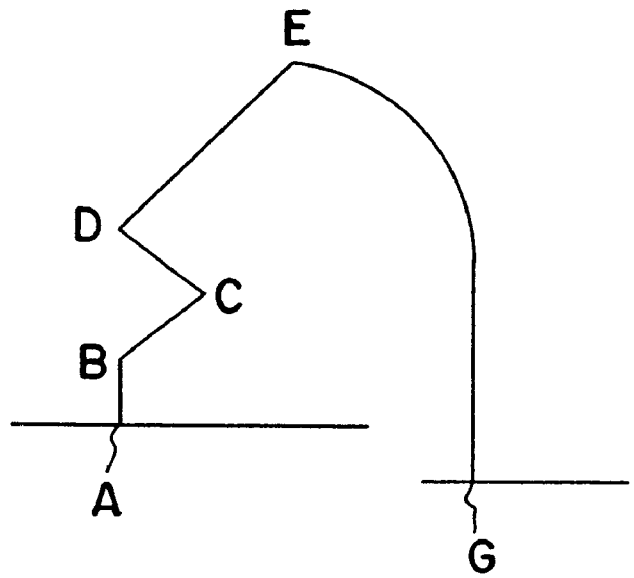
FIG. 2 shows a capillary track taken in the embodiment shown in FIG. 1.
Figure 4:
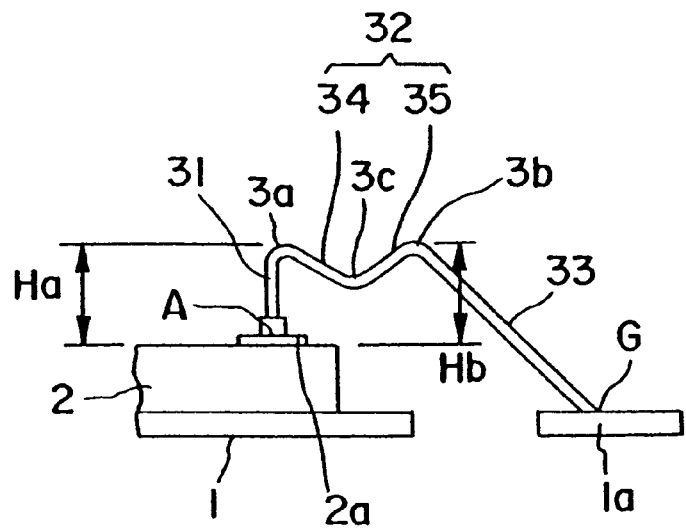
FIG. 4 is an explanatory diagram illustrating a semiconductor device with an M-shaped loop formed by the method of the present invention.

As shown in step (b), the capillary 4 is moved from point B to point C, which is located at an upward inclination in the direction of the second bonding point G (process from point B to point C in FIG. 2). It goes without saying that the amount of movement and the angle at which the capillary is raised in this case are set so that no damage occurs to the neck part 30 of the wire 3 (see step (e)). As a result, a first kink 3a is formed in a portion of the wire 3. The wire 3 delivered in the process from point A to point B forms the neck height part 31 shown in FIG. 4.

Next, in step (c), the capillary 4 is moved to point D which is located at an upward inclination in the opposite direction from the second bonding point G (process from point C to point D in FIG. 2), delivering the wire. In other words, the capillary 4 is moved obliquely upward in the direction of the first bonding point A. As a result of the steps (b) to (c), a second kink 3c is formed in the wire 3. The (length of) wire that is delivered in the operation from point B to point C (i.e., the length from the first kink 3a to the second kink 3c) forms the first horizontal wire part 34 shown in FIG. 4.

Next, in step (d), the capillary 4 is moved to point E, which is located at an upward inclination in the direction of the second bonding point G (process from point D to point E in FIG. 2), delivering the wire. As a result of the steps (c) to (d), a third kink 3b is formed in the wire 3. The (length of) wire that is delivered from point C to point D (i.e., the length from the second kink 3c to the third kink 3b) forms the second horizontal wire part 35 shown in FIG. 4. The (length of) wire 3 that is delivered in the step (d) forms the inclined part 33 shown in FIG. 4.

Afterward, the clamper (not shown) is closed. When the clamper is closed, no wire 3 is delivered even if the capillary 4 is subsequently moved.

Next, in step (e), the capillary 4 is caused to perform a circular-arc movement from point E or is caused to perform such a circular-arc movement and is then lowered, so that the capillary 4 is positioned at the second bonding point G, thus bonding the wire 3 (process from point E to point G in FIG. 2) thereto.

The operation from point E to the second bonding point G has no direct connection with the gist of the present invention; therefore, it goes without saying that the operation that is similar to the operations disclosed in the above-described Japanese Patent Application Publication (Kokoku) No. H5-60657 and Japanese Patent Application Laid-Open (Kokai) No. H10-189641 can be performed for the point E to point G, or any various other types of operations may be performed.

Figure 3:
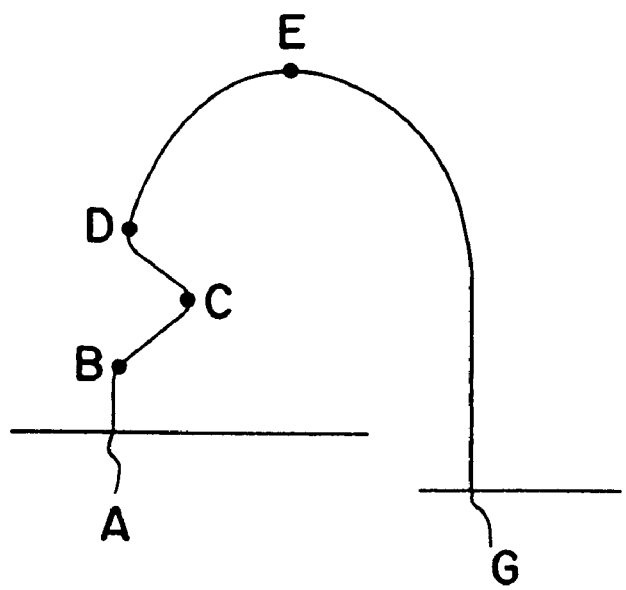
FIG. 3 shows a capillary track taken in another embodiment of the present invention.

In the above description, the track of the capillary 4 from point B to point C, the track from point C to point D and the track from point D to point E are straight lines as shown in FIG. 2. However, in cases where it is difficult to deliver the wire 3 due to the diameter, hardness or elasticity of the wire 3 or the shape or condition of the capillary 4, etc., it is possible to set the track of the capillary 4 so as to be a curve that passes through points B, C, D and E, e. g., a splined curve, etc., as shown in FIG. 3, instead of using the linear track shown in FIG. 2.

Though it depends upon the distance and height difference between the first and second bonding points A and G and other factors, the amount of wire delivered in step (d) or from point D to E is set to be the largest compared to the amount of wire delivered in other steps.

Figure 5:
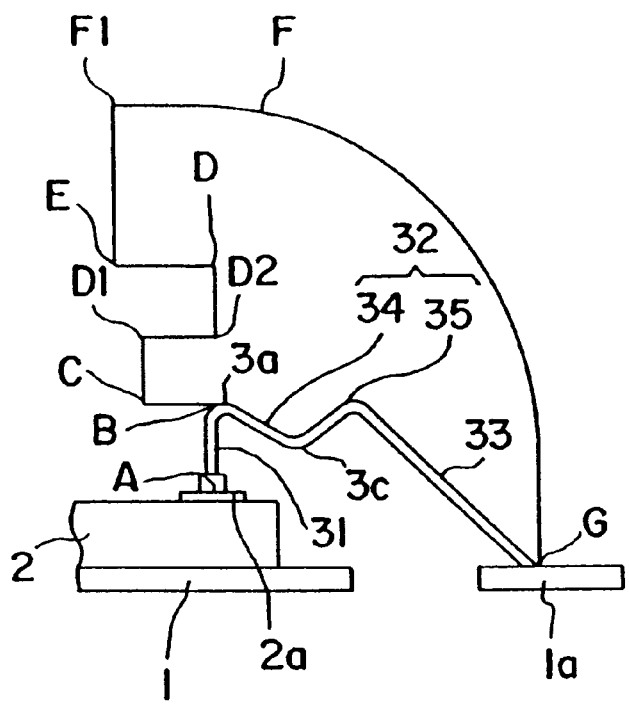
FIG. 5 is an explanatory diagram which illustrates a conventional capillary track and an M-shaped wire loop.
Figure 6:
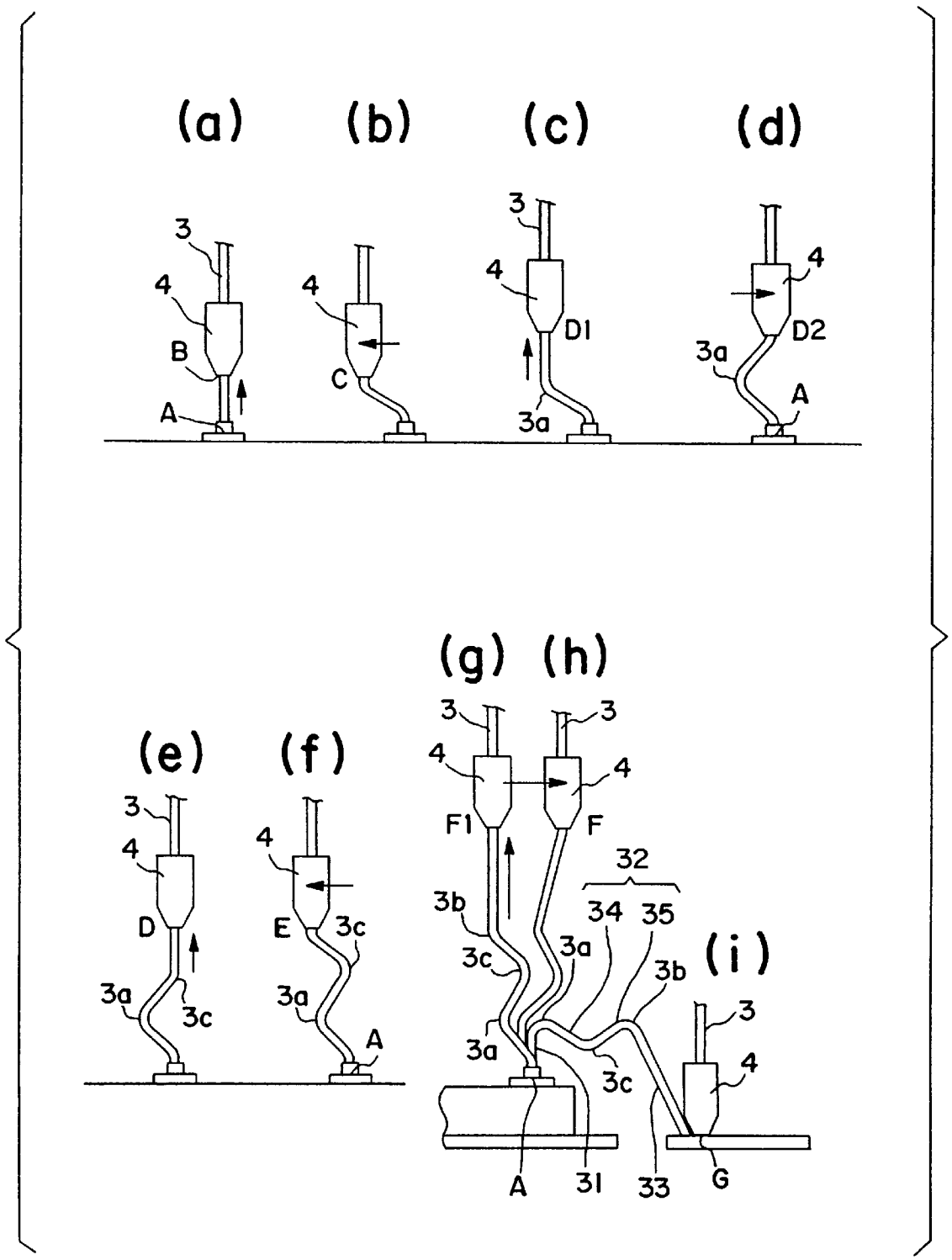
FIG. 6 shows the steps (a) through (i) of prior art wire bonding method.

In conventional methods, as shown in FIGS. 5 and 6, an extremely large number of steps (a) through (i) are performed, and in addition, the amount of movement of the capillary 4 is large. In the present invention, on the other hand, as shown in FIGS. 1 and 2, the number of steps required is small ((a) through (e)), and the amount of movement of the capillary 4 is also small. Accordingly, the bonding time can be greatly shortened.

Figure 7:
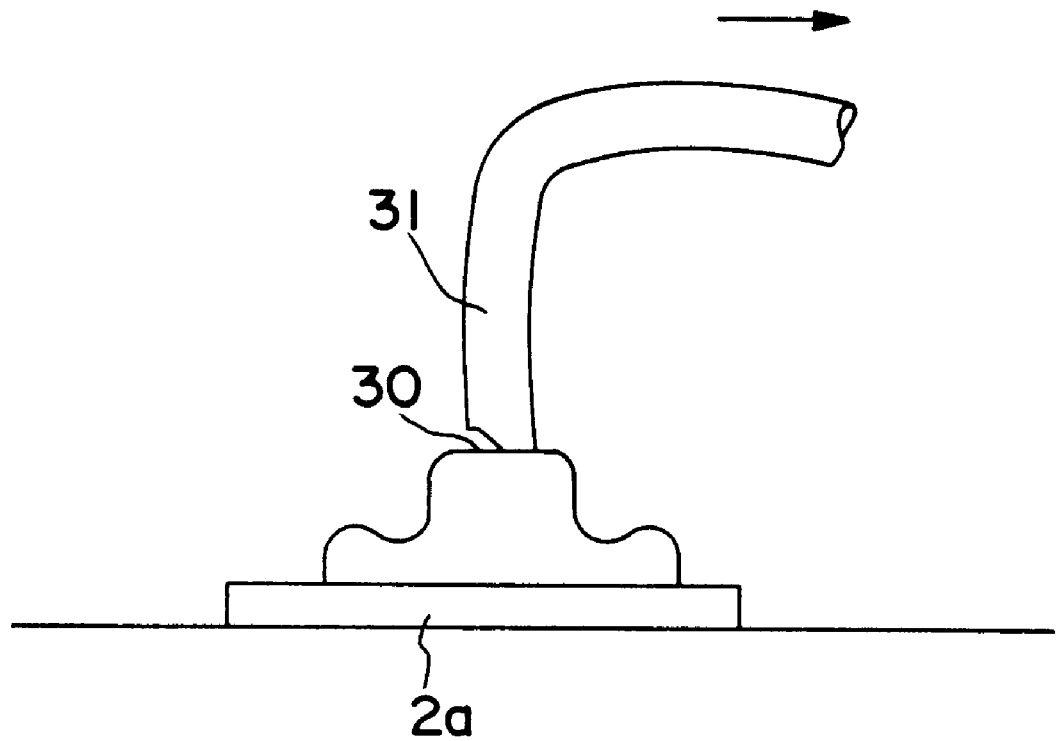
FIG. 7 is an explanatory diagram showing the problems with the conventional wire bonding method.

Furthermore, in the prior art shown in FIG. 6, the neck height part 31 which is bent by the reverse operation performed in step (b) is, by the steps from (h) to (i) shown in FIG. 6, brought back to its original position by being pulled in the pulling direction of the wire shown in FIG. 7. However, in the present invention, such a sequential movement (which is from the reverse operation to the operation that brings the neck height part 31 to its original position) is not taken. Therefore, the wire is less likely to be damaged compared to the prior art.

In the present invention, the first kink 3a and the neck height part 31 are formed in the steps (a) and (b) when the capillary 4 is raised to point B after bonding to the first bonding point A, and the capillary 4 is raised to point C which is located at an upward inclination in the direction of the second bonding point G. Accordingly, the height Ha of the kink 3a can be stabilized, and the wire loop shape can be also stabilized. As a result, whichever is higher of the heights Ha and Hb of the wire loop as a whole can be reduced to as low as 100 to 200 μm in height.

As seen from the above, in the present invention, the capillary is raised after a ball formed on the tip end of the wire extending from the tip end of the capillary is bonded to the first bonding point, the capillary is then moved to a position located at an upward inclination in the direction of the second bonding point, the capillary is then moved to a position located at an upward inclination in the opposite direction from the second bonding point, the capillary is further moved to a position located at an upward inclination in the direction of the second bonding point, and then the capillary is lowered so that the wire is bonded to the second bonding point. Accordingly, the track of the capillary is simple and the amount of movement of the capillary is small, and the bonding time can be shortened. Also, no damage occurs to the neck part of the wire. Moreover, a low wire loop shape in which the height of the wire loop as a whole is 200 µm or less can be stably formed.

What is claimed is:

1. A wire bonding method in which a wire passing through a capillary is connected to a first bonding point and second bonding point by the capillary, the method comprising the steps of:

raising the capillary after a ball formed on a tip end of the wire extending from a tip end of the capillary is bonded to the first bonding point, moving the capillary to a position located at an upward inclination in a direction of the second bonding point, moving the capillary to a position located at an upward inclination in an opposite direction from the second bonding point, moving the capillary to a position located at an upward inclination in a direction of the second bonding point, and lowering the capillary so as to bond the wire to the second bonding point.

2. A wire bonding method for connecting a first bonding point and second bonding point with a wire that passes through a capillary, comprising the steps of:

bonding a ball formed on a tip end of the wire extending from a tip end of the capillary to the first bonding point;

raising the capillary from the first bonding point, thus delivering the wire;

moving the capillary obliquely upward in a direction of the second bonding point, thus delivering the wire;

moving the capillary obliquely upward in a direction of the first bonding point, thus delivering the wire;

moving the capillary further obliquely upward in a direction of the second bonding point, thus delivering the wire; and lowering the capillary to the second boding point, thus bonding the wire to the second bonding point.

3. The wire bonding method according to claim 2, wherein the amount of wire delivered in the step of moving the capillary further obliquely upward in a direction of the second bonding point is larger than the amount of wire delivered in other steps in which the wire is delivered.

* * * * *